United States Patent
Brennan et al.

(10) Patent No.: US 6,434,731 B1
(45) Date of Patent: Aug. 13, 2002

(54) AUTOMATED PLACEMENT OF SIGNAL DISTRIBUTION TO DIMINISH SKEW AMONG SAME CAPACITANCE TARGETS IN INTEGRATED CIRCUITS

(75) Inventors: Thomas Charles Brennan, Rochester, MN (US); Kevin Charles Gower, LaGrangeville, NY (US); Daniel John Kolor, Wappingers Falls, NY (US); Erik Victor Kusko, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/427,301

(22) Filed: Oct. 26, 1999

(51) Int. Cl.[7] .............................................. G06F 17/50
(52) U.S. Cl. ....................................................... 716/10
(58) Field of Search ............................... 716/1, 2, 4, 7, 716/10, 12

(56) References Cited

U.S. PATENT DOCUMENTS

| | | | |
|---|---|---|---|
| 5,258,660 A | 11/1993 | Nelson et al. | 307/269 |
| 5,430,397 A | 7/1995 | Itoh et al. | 326/101 |
| 5,452,239 A * | 9/1995 | Dai | 716/17 |
| 5,557,779 A | 9/1996 | Minami | 395/500 |
| 5,790,841 A | 8/1998 | Scherer et al. | 395/558 |
| 5,790,941 A | 8/1998 | Peponides | 455/87 |
| 5,999,715 A * | 12/1999 | Sato | 716/5 |

* cited by examiner

Primary Examiner—Matthew Smith
Assistant Examiner—Thuan Do
(74) Attorney, Agent, or Firm—Karuna Ojanen

(57) ABSTRACT

An automated method for designing a signal distribution network in an integrated circuit confines the circuits relating to a particular signal, such as a clock signal, to multiple areas equally distributed over the integrated circuit. Each of the multiple areas have tightly-coupled logic connected to a root driver circuit in which the root driver circuit is connected to the signal input. Within the areas of tightly-coupled logic, user-defined placement circuits or groups such as a programmable clock delay having gates, delays, and splitters are connected to the root driver circuit in accordance with wire capacitance targets and input pin load balancing among all the multiple areas. The input pin load balancing and the wire capacitance targets of the user-defined placement groups connected to the root driver circuit in one of the multiple areas matches the input pin load balancing and the wire capacitance targets of other groups connected to other root driver circuits in other multiple areas. Thus, skew is minimized during the automated placement of the design of the signal distribution network.

10 Claims, 10 Drawing Sheets

AUTOMATED PLACEMENT OF SIGNAL DISTRIBUTION TO DIMINISH SKEW AMONG SAME CAPACITANCE TARGETS IN INTEGRATED CIRCUITS

TECHNICAL FIELD

This invention relates generally to the design of integrated circuits and more particularly, relates to the automated placement of a clock distribution network during the design of an integrated circuit.

BACKGROUND OF THE INVENTION

The term chip or integrated circuit as used herein is understood to be thousands to millions of transistors manufactured on a semiconductor substrate and wired together to perform a specific function. The wiring may be aluminum or copper or other conductive material. The number of transistors on a chip, the speed of each transistor, and the delay passing electricity through each transistor and each metal interconnect determine how fast the entire chip operates. The transistors may be configured into logic gates, RAM and/or ROM memory, I/O latches and circuits which input and output signals to and from the chip. Integrated circuits can be categorized into two broad classes: (1) custom circuits; and (2) application specific integrated circuits (ASICs). Custom integrated circuits are uniquely characterized and frequently require manual effort and much time to physically design the circuit. An example of a custom chip is a microprocessor circuit. Designing an ASIC, on the other hand, requires less time using existing technologies and circuits because the circuit is more straightforward. An example of an ASIC is a memory interface circuit.

During integrated circuit design, design engineers pay particular attention to the structure of the clock distribution network. The clock distribution network is the logical and physical structure which provides the pulse to strictly maintain the correct sequence of events throughout the integrated circuit. Such events include receiving and sending data through I/O circuits, on-chip processing and logical operation, and storage of data in memory. Clock signals are typically distributed from a single clock source to many destinations which may be located far apart within the computer. For several reasons, the clock signals do not arrive at all destinations the same time and the difference in time between the arrival of the clock signal at different destinations is called skew. As computers become faster and faster because their clock frequency increases, skew becomes a substantial percentage of the clock period and may actually limit the speed at which the computer can operate. In a physically larger computer system, moreover, the distance between destinations and the clock distribution circuits can vary dramatically, increasing clock skew.

A typical path for a clock signal includes many electronic components, such as gates, integrated circuit (IC) interconnect metals, and wires. Each of these provides an opportunity for introducing undesired clock skew. The amount of time it takes a signal to travel along a wire is called its electrical length, and it depends upon the physical length, the capacitance, and the resistance of the wire path. All else being equal, a signal takes more time to travel a long path than a short one. If the electrical lengths of all the clock signal paths are not equal, skew is introduced.

The clock distribution network often further includes several levels of fanout gates and amplifiers or drivers. Skew results if there are unequal numbers of gates in separate signal paths or if there are variations in how long it takes a signal to pass through different gates. How long it takes a signal to pass through a gate depends upon several factors including the propagation delay characteristics of the particular type of gate, the number of loads the gate is driving, and the temperature of the gate. Any variation of these parameters between two signal paths will cause skew in the signals. Even if these factors are identical, there may be variations between individual gates of the same type.

Crosstalk from adjacent signals can be another cause of clock skew. For example, if during a transition from one logic state to another, a signal's voltage level is altered by crosstalk, then the point in time when the signal is determined to have switched will be altered, thus introducing skew. Another source of skew is when the logic level is determined by reference to a power supply voltage. For example, if the logic levels are defined as voltages relative to ground, any noise on a logic gate's ground reference will affect the time at which the gate determines an input signal to have switched.

There are reasons to minimize and, if possible, to eliminate skew. First, skew limits the speed at which a computer system can operate. Computer tasks are often performed serially with data passed from one stage of the computer to another on subsequent clock cycles. The time period of the clock must be sufficient for a stage to process the data and propagate it to the next stage. In addition, the clock period must allow for any skew between the clock signals at the various stages. For example, if one stage is clocked late because of skew but the next stage is clocked on time, the data from the first stage may not yet have arrived when the second stage is clocked. The clock period thus must be stretched to accommodate not only the time needed for the first stage to process and propagate the data, but also for skew between the clock signals present at the two stages. On the other hand, clock skew may prevent a system from slowing down when the clock frequency is decreased. A clocked electronic system, moreover, may not function at any frequency because of early mode timing faults caused by clock skew.

Computers are typically designed modularly with circuitry placed on various removable circuit boards or modules. Without consideration of the effects of clock skew in the system, the ability of a board or module to be interchanged from one machine to another is severely constrained or even prohibited. The amount of clock skew on a particular module may be different from that on other modules because the time it takes a signal to propagate through a particular type of logic gate varies from gate to gate and each module may have different types and numbers of gates. A system designed to accommodate skew present on one module may not work with other modules. The result is that some modules may not function in all machines because of clock skew.

There are several techniques to reduce clock skew. The design engineer can attempt to equalize the wire between the clock source and all destinations by distributing the clock signals radially from a clock distribution point physically located near the center of the machine. The designer can also equalize the number of gates and types of gates in all clock signal paths. Clock skew can also be reduced by equalizing the load driven by gates and various signal paths. Because these techniques affect the fundamental layout of the circuits, they can only be performed during the physical layout of the system.

There are also techniques to introduce delay into the clock distribution network that can be performed either or both during the design and during the manufacture or installation of the system. The critical parameter is the difference in delay between the various signal paths, not the actual amount of delay in any given path. Thus, a specific amount of delay is introduced in the faster signal paths to match the electrical length of the slowest signal paths and thus compensate for skew. Delay line tuning involves connecting a clock signal path through a delay line to provide multiple outputs, each corresponding to a different delay amount. The output corresponding to the needed delay is selected at the time of installation by reference to other clock signal paths.

The effectiveness and practicality of these methods varies. Equalizing trace lengths, number of gates, and loading must be done during the initial design phase and, as such, cannot account for design changes or component variations. Equalizing the number of gates in the path and the gate loading may not be possible in all circumstances because of other design constraints of the circuit. A previously equalized circuit may require the addition of new circuitry not conceived of during the initial design phase and the equalized paths may no longer be equalized after the addition of new circuitry. Delay line tuning, however, is adjustable and can skew compensate a circuit even after the addition of new circuitry.

The design of the clock distribution network, however, is only part of the physical design process. The clocking logic must be placed and routed along with the rest of the logic of the entire integrated circuit. The term "placed" refers to the assignment of a specific location of the individual components on the integrated circuit. Automated placement is performed by software programs capable of manipulating and moving very large number of circuits, gates, latches, etc, during the design to be placed on the semiconductor substrate of an integrated circuit. Automated routing refers to the interconnection of the circuits by a software program during design.

The physical design process thus must meet not only the skew requirements of the clock distribution network but must further meet the demands of the entire automated placement and routing of the integrated circuit. Historically, the clock requirements have interfered with the physical design process because some logic circuits need be delayed, others not so much or not at all thus making the placement and routing process for the entire integrated circuit including the clock distribution network a difficult and time-consuming aspect of its design.

It is thus an object of the present invention to provide an automated procedure to include clock distribution in the design of an integrated circuit.

SUMMARY OF THE INVENTION

This object and other objects and advantages that will become apparent are realized by a method of automated placement of circuit elements in the design of an integrated circuit, comprising the steps of defining a plurality of bounding boxes, each bounding box having a root driver and within the bounding box, connecting a first circuit element of at least one user-defined placement group to each root driver maintaining substantially the same capacitance target within all of said bounding boxes. The root driver may be a driver circuit of a clock circuit in a clock distribution network. Further, the clock distribution network may be a second level clock distribution network of a computer system memory interface. In an embodiment, the user-defined group may comprise a plurality of circuit elements comprising a gate connected to the root driver as a first circuit element, a clock delay to receive the output of the gate, and a clock splitter connected to receive the output of the clock delay. The clock delay may further be a programmable clock delay in which the first stage of the programmable delay is contained within the bounding box. The clock delay, moreover, may have more than one stage and may have multiple programmable stages.

In a preferred embodiment of the invention, the invention may be considered a method of automated design of a clock distribution network having minimal clock skew throughout an integrated circuit, comprising the steps of defining a plurality of bounding boxes having tightly-coupled logic, each of the bounding boxes having a clock root driver connected to an input source of a clock signal; connecting at least a user-defined placement clock delay group within each bounding box to each root driver maintaining substantially the same wire capacitance target and input pin load balance for each of the user-defined placement clock delay groups having a same clock delay within all of the bounding boxes, in which the user-defined placement clock delay group comprises having a gate connected to the root driver, a first stage of a programmable delay electrically connected to the gate, and a clock splitter connected to the output of the programmable delay.

In another embodiment of the invention of designing an integrated circuit, the method may comprise inputting a design specification of the integrated circuit having a clock source into an automated design program; determining the number of clock circuits required for the integrated circuit; dividing the design of the integrated circuit into as many areas as the number of clock circuits and preplacing a clock root driver connected to the clock source in a central area of each of the areas. The method further comprises placing tightly-coupled logic together in a vicinity surrounding each of the clock root drivers and in each of the vicinities, placing user-defined groups of the tightly-coupled logic to be electrically connected to the clock root driver in each of the vicinities; determining capacitance targets for a critical circuit element of each of the user-defined groups such that the critical circuit element of one of the vicinities corresponding to the same critical circuit element of any other vicinity is within the same capacitance target of the clock root driver; and then recording the coordinates of each clock root driver and each critical circuit element for each vicinity.

The invention may further be realized in a computer readable medium having an executable program operative to control a computer for designing a clock signal distribution network on an integrated circuit, the program comprising: evaluating a specification for an integrated circuit with respect to the clock signal distribution network and determining the level and number of clock distribution circuits having tightly-coupled logic required for the integrated circuit; arranging the clock distribution circuits from an input source of the clock signal so that the clock distribution circuits are distributed on the integrated circuits; placing a root driver connected to the input source in each of the clock distribution circuits; and placing a number of user-defined placement clock delay circuit groups to be electrically connected within a capacitance target to the root driver such that the capacitance target for one of the user-defined placement clock delay circuit groups in one of the clock distribution circuits is substantially the same as the capacitance target of the same user-defined placement clock delay circuit group of another of the clock distribution circuits.

The invention is also an apparatus to design a signal distribution network in an integrated circuit, comprising a means to input a design specification of the integrated circuit wherein the design specification has an input source of an electronic signal to be distributed throughout the integrated circuit; a means to route the signal from the input source to a plurality of areas in which tightly-coupled logic circuits are to be placed, a means to place a signal root driver in each of the areas, a means to determine a capacitance target for a number of user-defined placement groups to be connected to each signal root driver such that the capacitance target minimizes skew of the signal distributed throughout the integrated circuit, a means to place the user-defined placement groups in each of the areas in accordance with the capacitance targets, and a means to record positions of the signal root driver and the user-defined placement groups.

BRIEF DESCRIPTION OF THE DRAWING

For a more complete understanding of the present invention and its advantages, reference is now made to the following description of the preferred embodiments of the invention taken in conjunction with the accompanying drawing in which.

DETAILED DESCRIPTION OF THE PREFERRED EMBODIMENTS OF THE INVENTION

Figure 1:
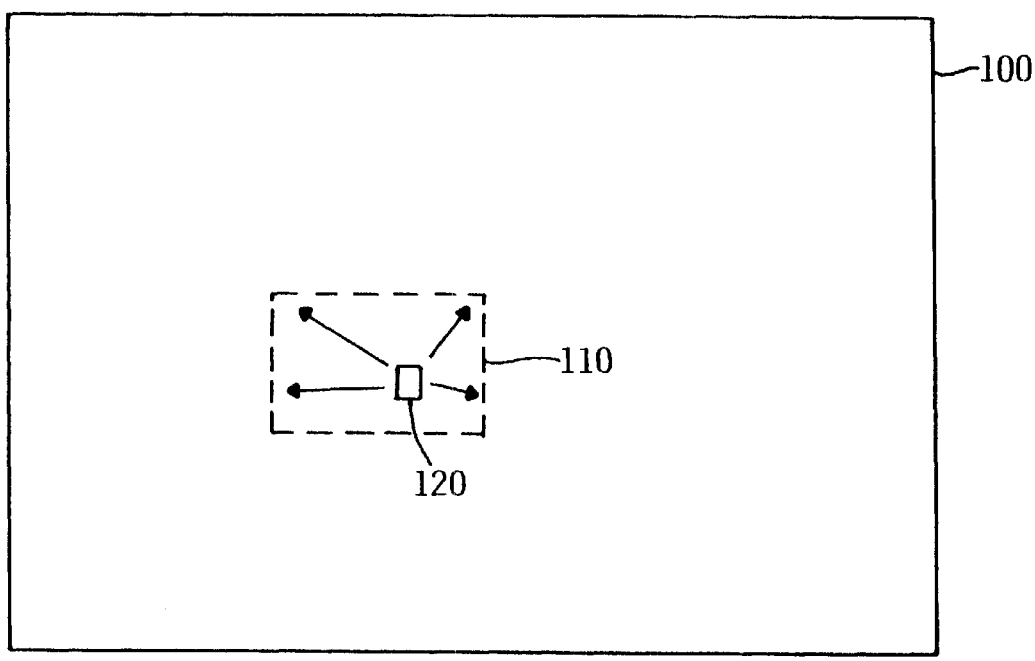
FIG. 1 illustrates the concept of a bounding box for tightly grouped logic within an area of an integrated circuit in accordance with principles of the invention.

With reference to the figures wherein like numerals refer to the same or similar elements throughout and in particular with reference to FIG. 1, shown is an area 100 of a semiconductor chip substrate in which a number of integrated circuits will be positioned during the design. A region called a bounding box 110 is shown having dimensions determined by the number and function of circuits to be placed within it. A representation of one such circuit 120 is shown. The circuits within the portion of the integrated circuit circumscribed by the bounding box 110 have electrical and mechanical requirements, i.e., short signal requirements, floor planning requirements, proximity to the I/O circuits, and logic requirements, i.e., tightly coupled logic, that require the circuits to be within close proximity to each other and to other circuits 120 within the bounding box 110.

Figure 2:
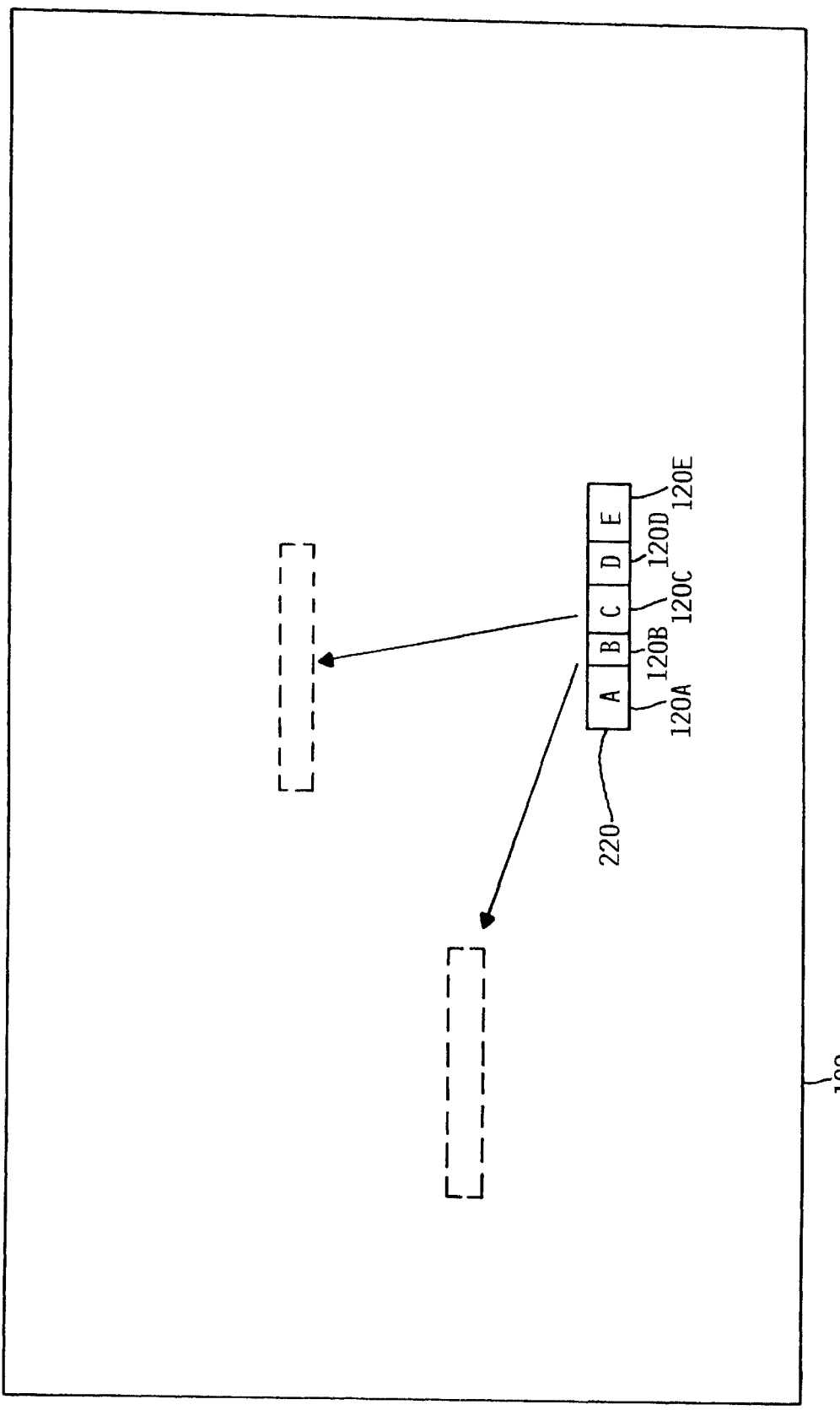
FIG. 2 illustrates the concept of grouping circuits within an area of an integrated circuit in accordance with principles of the invention.

FIG. 2 illustrates a group 220 of circuit elements 120A, 120B, 120C, 120D, 120E arranged as a user-defined placement group in which design rules define the placement of one circuit element with respect to another of the group. A circuit element as defined herein is a circuit as part of a user-defined placement group. Although only five circuit elements have been shown in group 220, more or less circuit elements may be configured as a functional group. Moreover, although the circuits have been shown as positioned horizontally adjacent to one another, they may be placed vertically or diagonally or in another spatial arrangement so long as the proximity to retain the functionality of the group is maintained.

Figure 3:
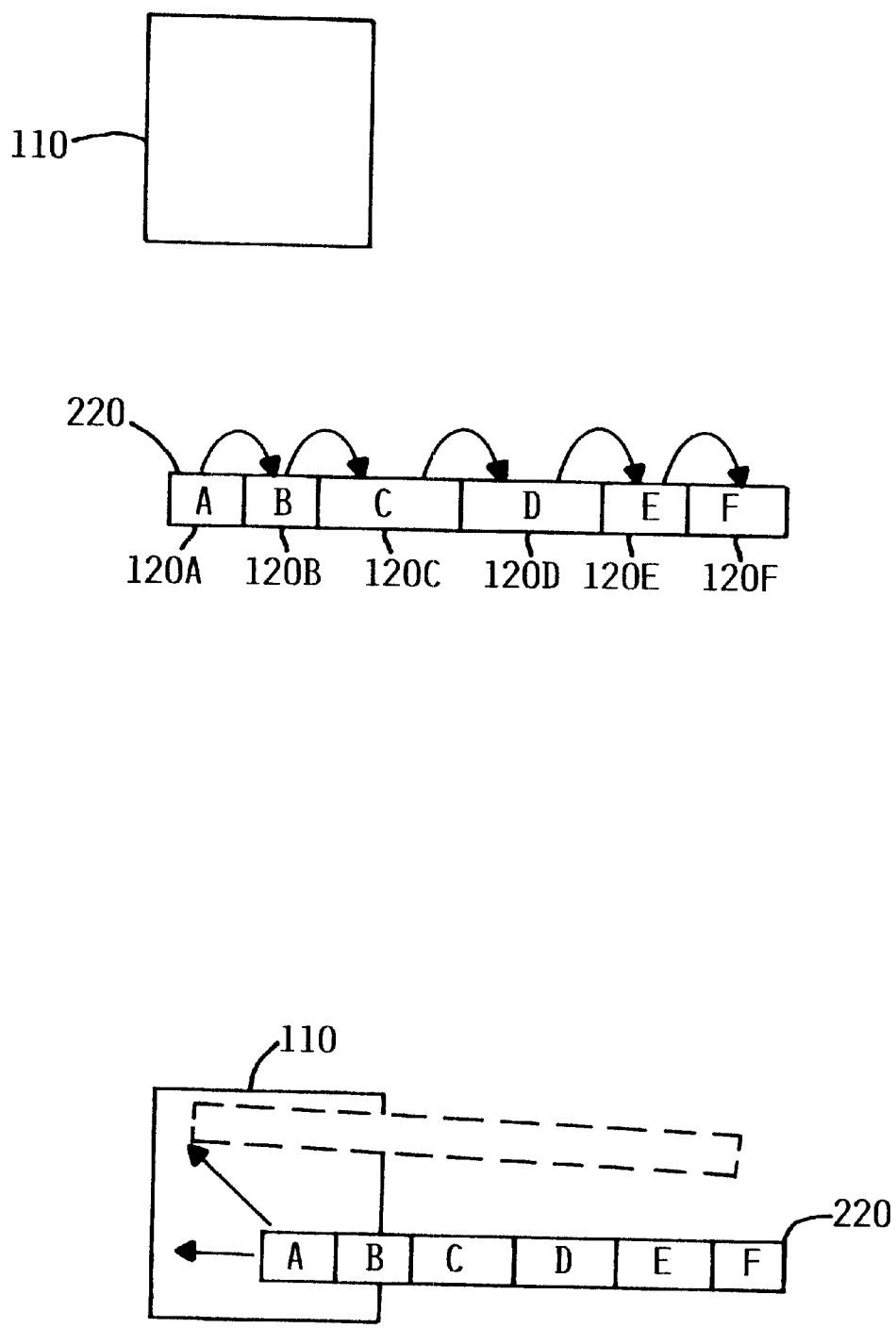
FIG. 3 illustrates the principles of placing a grouping circuit of FIG. 2 in a bounding box of FIG. 1.

FIG. 3 illustrates the combination of the concepts of FIG. 1 and FIG. 2. Some circuit elements of a user-defined placement circuit group 220 must be placed within bounding box 110 to satisfy the electrical requirements for the tightly coupled logic. Certain circuit elements of the user-defined placement group 220, however, may extend beyond the boundaries of the bounding box as shown in FIG. 3 because, in some instances, the constraint is that only one or more critical circuit elements 120A of the user-defined placement group 220 need be within the tightly coupled logic of bounding box 110. Moreover, without having further information, circuit element 120A may be positioned anywhere or "float" within the bounding box 110.

Figure 4A:
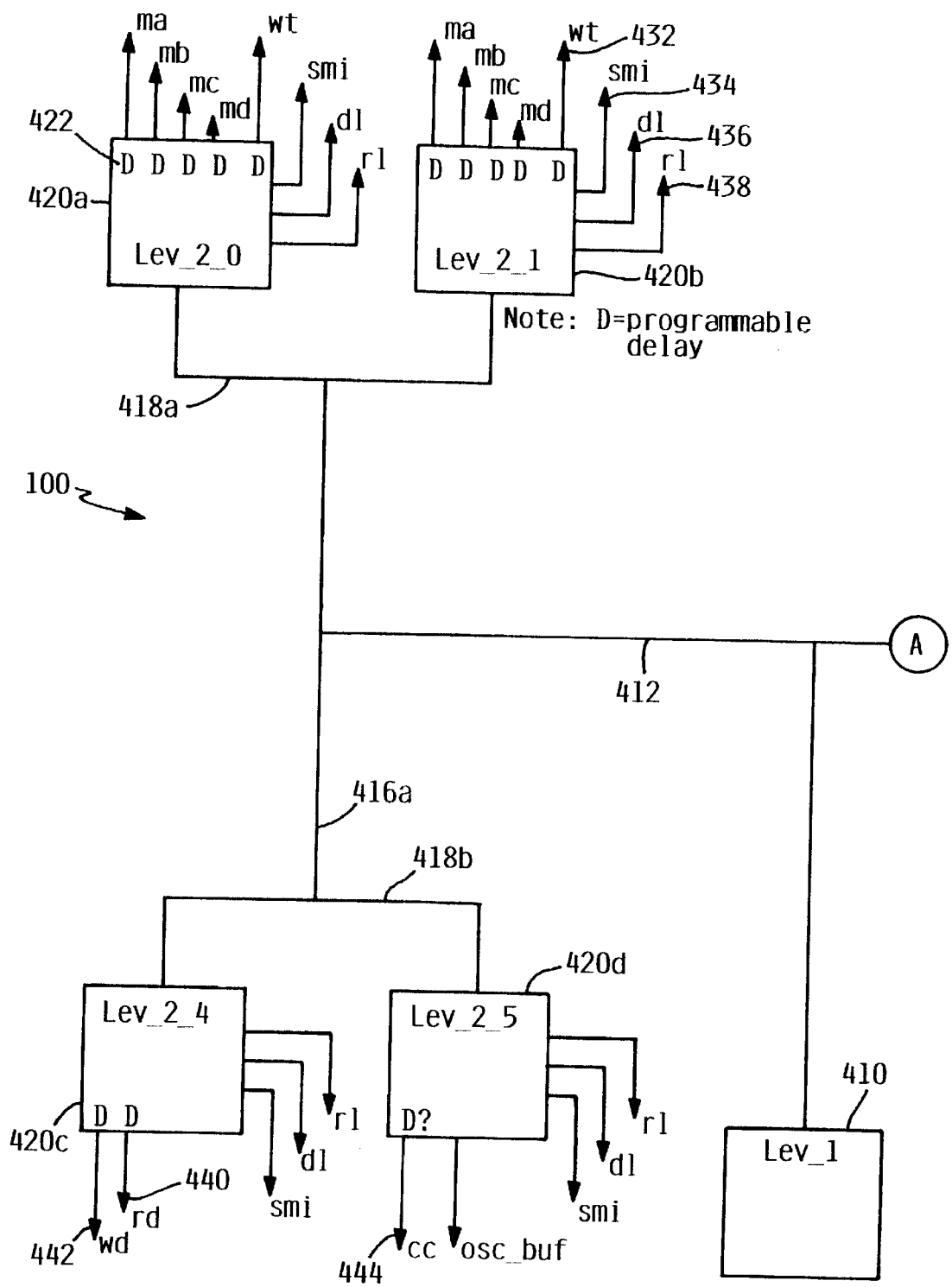
FIG. 4 illustrates a clock distribution network of a portion of a computer memory system interface. It is suggested that FIG. 4 be printed on the face of the patent.
Figure 4B:
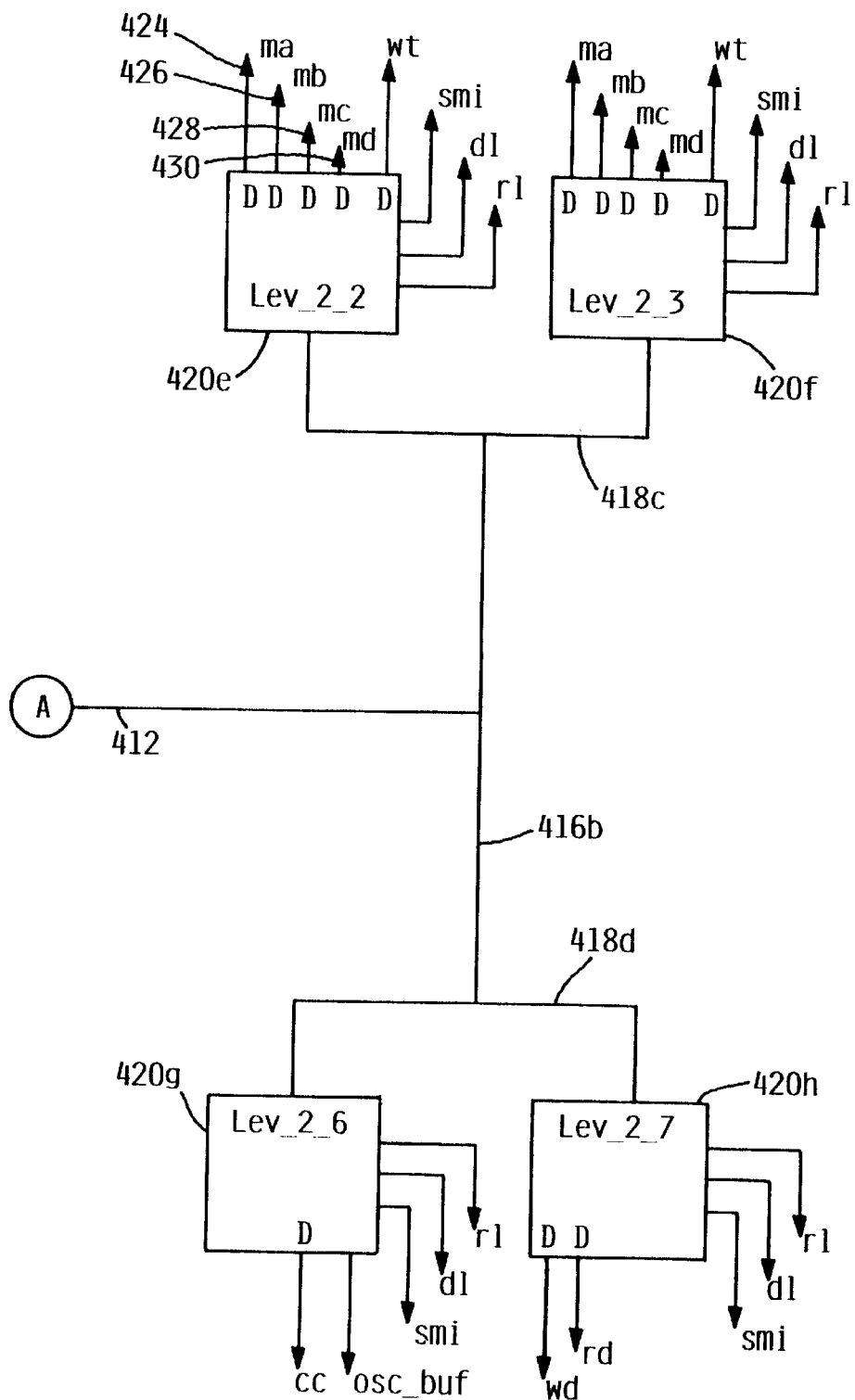

FIG. 4 illustrates the concept of using several bounding boxes for distribution of a clock signal within a computer system memory interface clock distribution on an integrated circuit 100. The clock distribution of the system memory interface 100 is shown in an H-tree arrangement which has a hierarchy of clock circuits or macros 420a–420h for amplification, delay, and splitting. A clock signal is input into the system memory interface 100 at a first level clock circuit macro 410 in which the clock signal may be amplified to overcome loss of signal strength from wire attenuation and coupling. The signal may also be delayed in order to control skew. It is a very common circuit design to split the clock signal into multiple second or subsequent level clock circuits. In the illustration, the clock signal from the level one clock circuit 410 is divided at path 412 and again at paths 416a and 416b. Each path 416a and 416b is further split at paths 418a and 418b, 418c and 418d. Each of these paths 418a, 418b, 418c, and 418d then provide the clock signal to multiple second level clock circuits/macros 420a and 420b, 420c and 420d, 420e and 420f, and 420g and 420h, respectively. Thus, the original clock output from the level one clock circuit 410 is split three times along paths 412, 416 and 418. Each of the clock circuits/macros 420a–420h also typically comprise drivers, delay structures, filters, conditioners and splitters, as is known in the art.

At this time, only one of the clock circuits/macros 420a–420h will be discussed and will be generically referred to as clock circuit/macro 420. It is to be understood that certain circuits and other elements in the clock circuits/macros 420a–420h may be identical, but also that each of the clock circuits/macros 420 may have other circuits which may be unique to a particular clock circuit/macro. Indeed, it is not intended that each clock circuit/macro 420a–420h all have identical functions and be of identical size but rather that the invention accommodates differences in the number, types, and arrangement off circuits within each clock circuit/macro 420.

The delay structures 422 in the second level clock circuits 420 are represented by the letter D and are preferably a programmable clock delay having multiple stages such as in "Dual Mode Programmable Delay Element", U.S. Pat. No. 6,222,407 issued Apr. 24, 2001 and "Programmable Delay Element" of U.S. patent application Ser. No. 09/263,671, filed Mar. 5, 1999, both of which are owned by the assignee herein and which are hereby incorporated by reference in their entireties.

Each of the signals output from each of the clock circuits/ macros 420a–420f having a common label, e.g., ma 424, must have the same programmable clock delay. In other words, the signal ma 424 must be output from the clock macro 420a at substantially the same time as signal ma 424 from clock macro 420f for proper functioning of the integrated circuit. Examples of other output signals from the second level clock circuits/macros 420 include other programmable delays, mb 426, mc 428, md 430, rd 440, wd 442; test clocks dI 436 and rI 438, a copy of the oscillator cc 444, the nondelayed core clock smi 434, a write signal wt 432, and other signals known in the art of clocking circuits. Minimizing skew is critical in a system memory interface because skew not only limits the maximum frequency of operation but it also impacts both internal latch to latching timings and external DRAM device setup and hold timings by the signals produced by the skewed clock signals, e.g., ma, mb, mc, md, wd, wt, rd, etc.

Figure 5A:
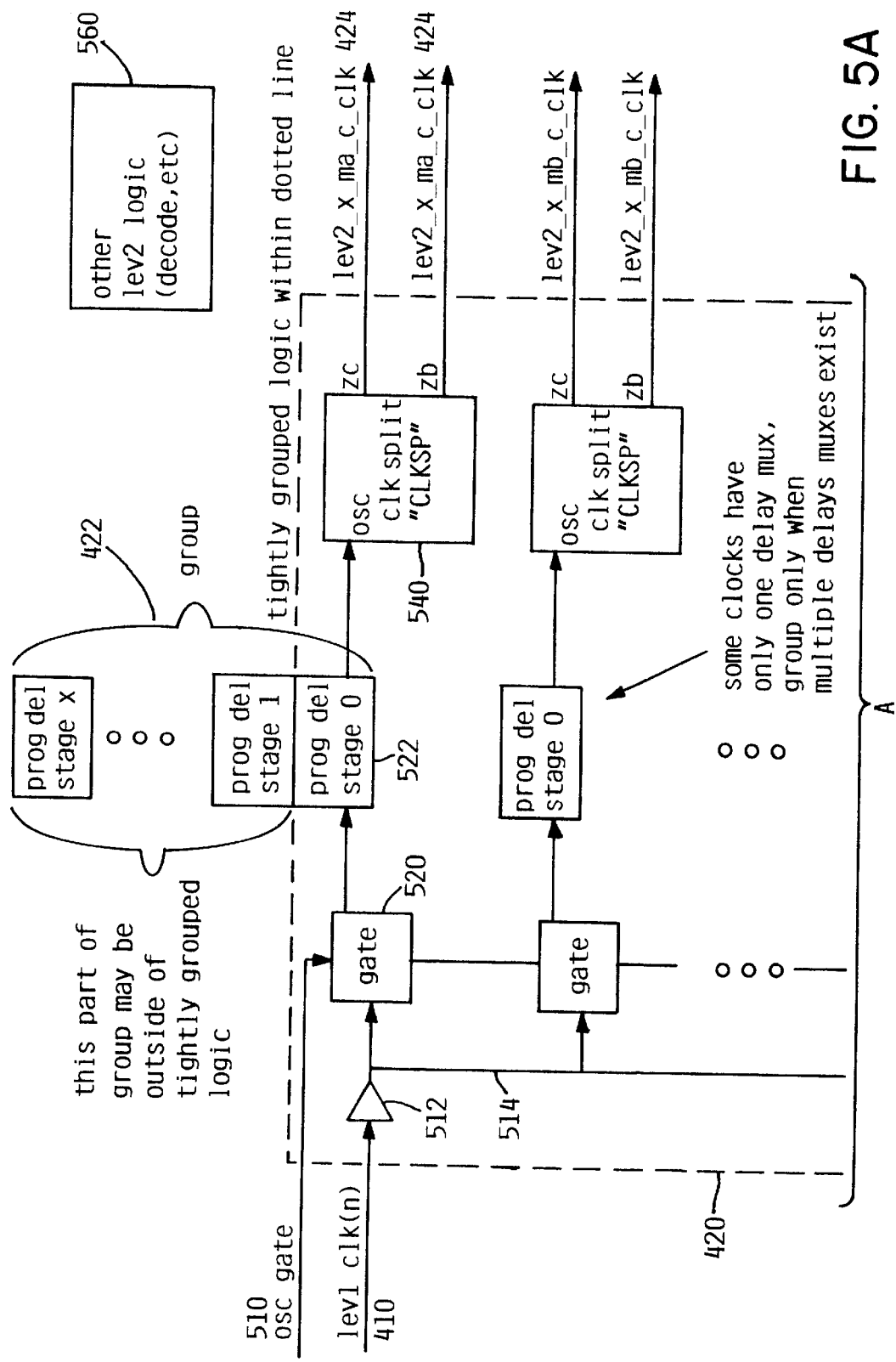
FIG. 5 is a simplified block diagram of a number of circuits including clock delay circuits as an example of tightly grouped logic of a clock distribution network of a computer memory system interface.
Figure 5B:
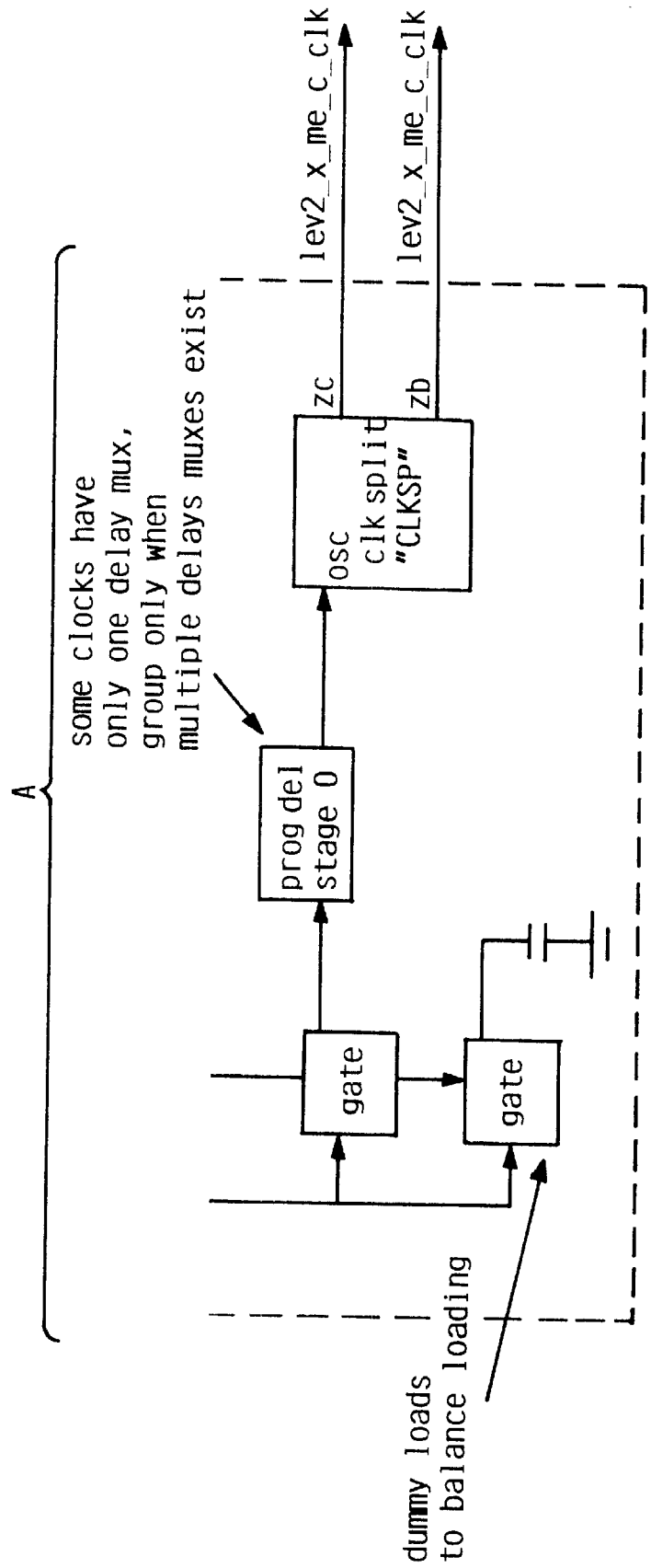

FIG. 5 illustrates one of the level two clock circuits/ macros 420 as a preferred embodiment of the tightly coupled logic. Inputs to the clock circuit/macro 420 include an oscillator signal 510 to gate the input clock signal 410. The input clock signal is buffered, amplified, and or conditioned by driver circuit 512, referred to as the root driver, of which there is one root driver 512 per clock circuit/macro 420. The buffered and amplified clock signal is output from root driver 512 along root driver net or wire 514 to each gate 520. From gates 520, the clock signal is delayed through a programmable delay 422 which may have one or more multiplexed stages. The circuit comprising gate 520, programmable delay 422, and clock splitter 540 comprise a user-defined placement group. The delayed output clock is divided at the clock splitter 540 and is output as signal ma 424. Gate 520, the splitter 540, and only the first stage 522 of the delay 422 rather than all the delay stages are required to be within the bounds of bounding box 420 which gives more freedom for the auto-placement program to move the user-defined placements groups within bounding box 420. Other logic 560 may also be in close proximity to the root driver 512 of clock circuit 420, some of which may comprise other tightly coupled logic circuits and other user-defined placement groups as well. It will be understood that only a portion of the clock circuit 420 is described. Clock circuit 420 may include other delays and circuits as will be recognized by one skilled in the art.

The placement of the user-defined placement groups along root driver net or wire 514 is considered with care. The first circuit element of each user-defined placement group, which in the example given is gate 540, is placed along the root driver net 514 within a specified range of wire capacitance for that user-defined placement group. Also considered is the number of input pin loads of the first circuit element of each user-defined placement groups, i.e., in the example provided, the gate 520, and any dummy loads connected on the root driver net 514. This input pin load capacitance of each clock circuit/macro 420a–420f should be balanced in the sense that it is the same within each clock circuit/macro 420. Thus, as defined herein, the term capacitance target shall be understood to mean both the wire capacitance of the root driver net 514 from root driver to each respective load as well as the input pin load balancing. In the preferred embodiment, input pin load balancing occurs when the same number and the same circuits are positioned on the root driver net 514 of each clock circuit/macro 420a–420f. Dummy loads, moreover, are added in order to balance the loads within the clock circuits/macros 420a–420f if one or more clock circuits/macros 420a–420f do not have the same user-defined placement groups as other clock circuits/ macros. In fact, in order to minimize skew on the entire chip, the target capacitance, i.e., the input pin loading and the wire capacitance, of each root driver net 514 in each clock circuit/macro 420a–420f is kept to within substantially the same values. Matching the capacitance targets in this process ensures that the skew introduced by the outputs of each respective root driver 512 between the various level two clock circuits 420a–420h is minimized. Because the root driver 512 of each of the level two clock circuits 420a–420h buffer and drive the same loads and have substantially the same wire capacitance, the signal propagation time to the inputs of gates 520 of each clock circuit 420a–420h should be as close as possible. Without this capacitance target, the delays having only one stage of delay could be placed randomly within the bounding box 120 but this would cause the output of root driver 512 between each of the level two clock circuits 420a–420h to be at different times and the skew would vary from clock circuit/macro to clock circuit/ macro.

Figure 6:
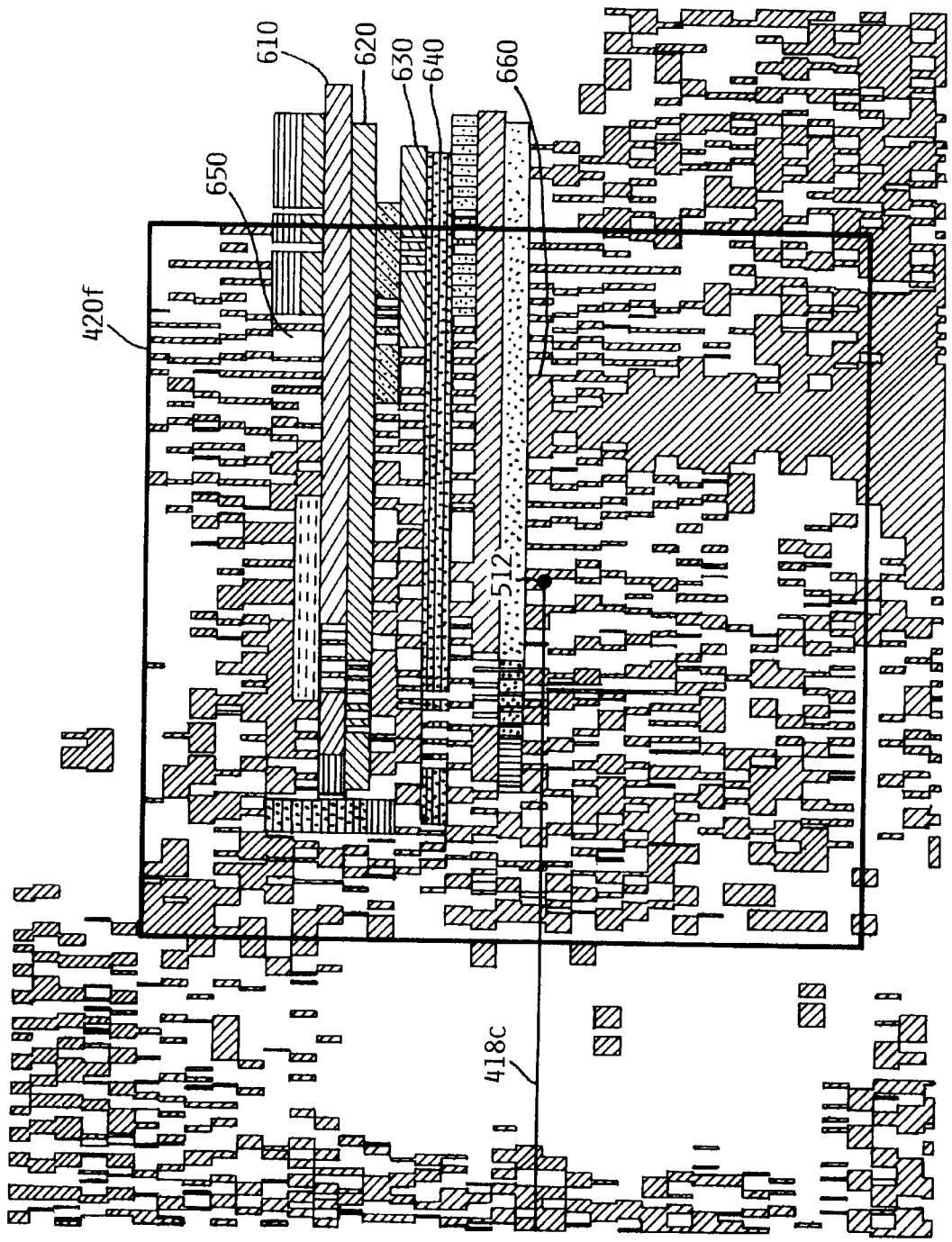
FIG. 6 is an enlargement of a second level clock and other electronic circuits comprising tightly grouped logic of the integrated circuit of FIG. 4.

FIG. 6 is an enlargement of a bounding box having tightly coupled logic as clock circuit 420f of FIG. 4. The wire 418c connects the level one clock/macro 410 (shown in FIG. 4, not shown in FIG. 6) to the root driver 512 located, preferably in a fixed position near the center of the second level clock/macro 420f. The white spaces 650 represents spaces in the clock circuit/macro 420f which do not have any circuits. The longer shaded bars 610, 620, 630, 640 represent the user-defined placement groups having the programmable delays in which a the first delay stage is the critical circuit element at the leftmost end is located within the bounding box and the first element of the user-defined placement group, the gate 520 (not shown) is at the capacitance target of the root driver 512. Note that other stages of the programmable delays 620, 620, 630, 640 are shown external to the bounding box. Other circuits of the clock circuit/macro 420f are shown in black and dark grey with black borders 660.

Figure 7A:
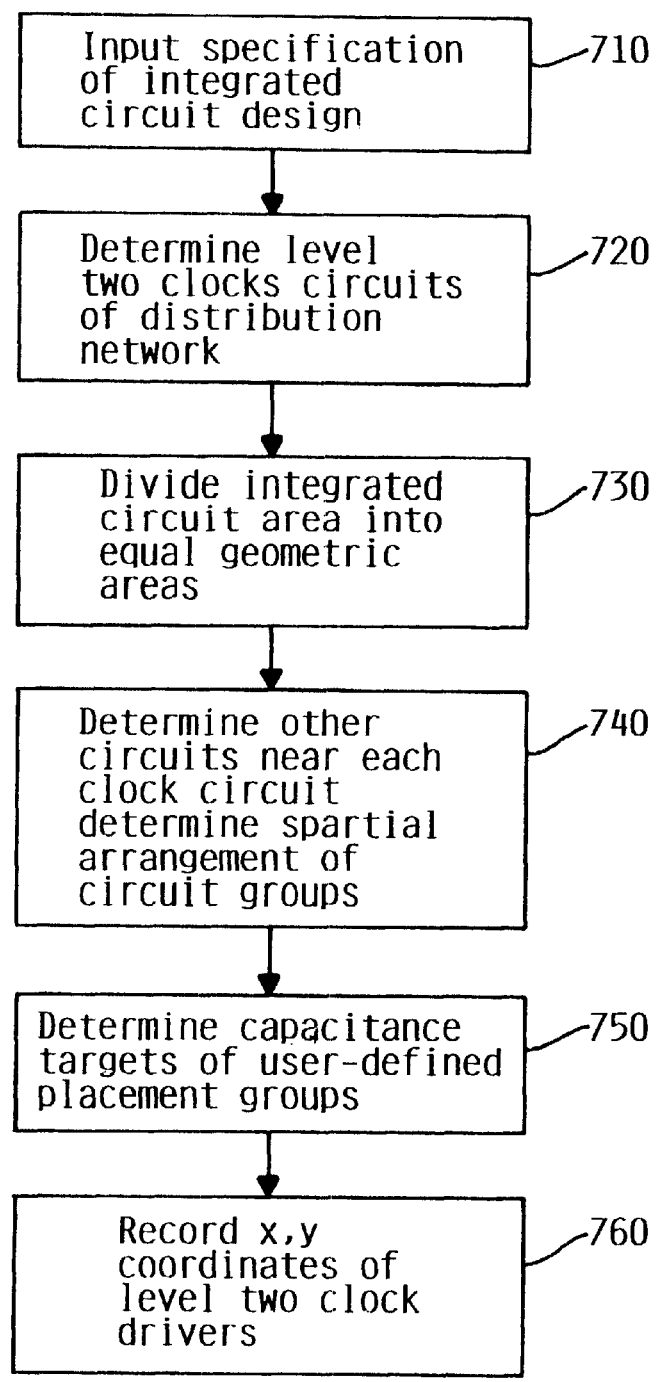
FIGS. 7A and 7B are is a high level flow charts of an automated process to include a clock distribution network into the design of an integrated chip.
Figure 7B:
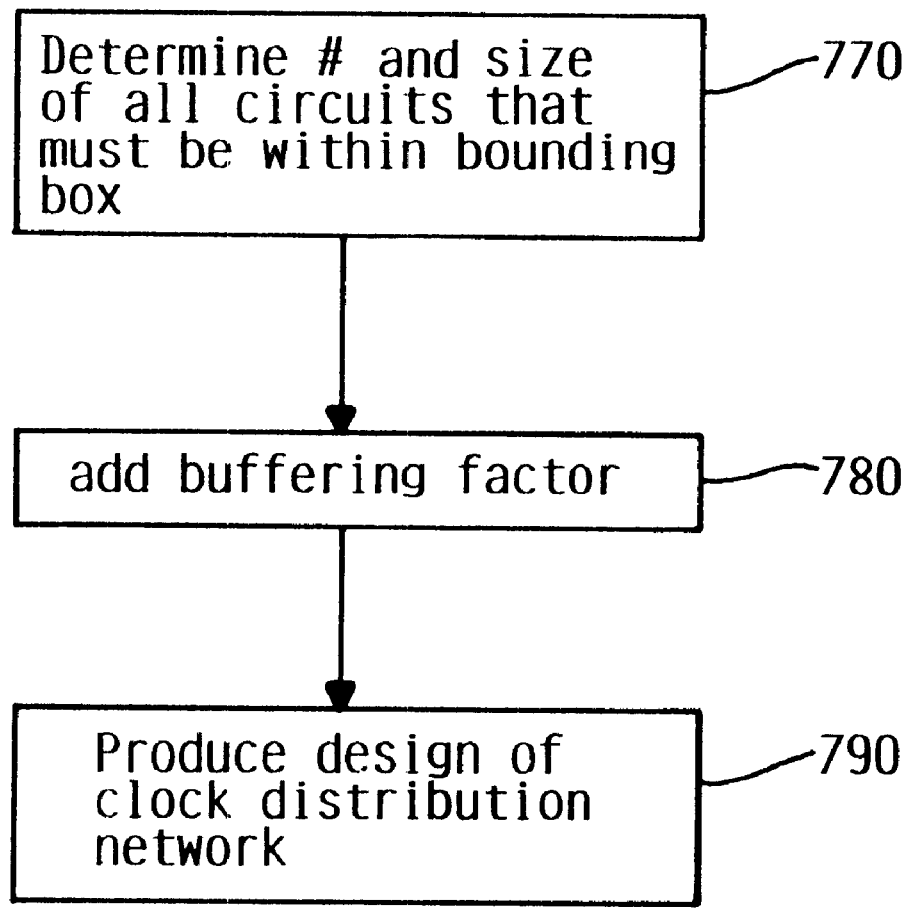

FIG. 7 is a simplified flow diagram of a process of the automated placement of the clock distribution network of the system memory interface of the preceding figures. Such a computer implemented process may be input to the computer using a computer readable format such as a floppy disk, a CD ROM, through a computer network such as a local area network or the Internet, or may be stored in the computer's memory. Such a process may be included in other software programs used to design integrated circuits and thus the scope of the invention includes the media through which such a process can be input into a computer for use.

In step 710, the design specification of the integrated circuit is input. The automated process continues by determining the required number of clock circuits/macros for a desired second level clock distribution network in step 720. In an integrated circuit there are usually a minimum of four second level clock circuits/macros with eight or more being typical. The program then, in step 730, divides the integrated circuit surface area into as many areas as there are clock circuits/macros, preferably equal size areas, and preplaces a root driver of a clock circuit in a fixed position in each of the areas. For example, if there are four clock drivers, each root driver would be placed in approximately the center of four quadrants of the integrated chip. By fixing the position of the root driver 512 in each bounding box, the wiring from the first level clock macro 410 to each second level clock/macro 420a–420f need only be accomplished once. In step 740, the circuits to be placed in tightly coupled logic are placed in a restricted vicinity surrounding each clock root driver called the bounding box. Those critical circuit elements, such as a first stage of a programmable clock delay, of the user-defined placement groups required to be positioned in the bounding box are positioned. In this manner, the user-defined placement group may be spatially arranged within the bounding box with a portion external to the bounding box. Then the wire capacitance target and the input pin loading for each user-defined placement group with respect to the clock root driver net line is determined in step 750 and the x,y coordinates of the clock root driver is recorded in step 760.

By matching the capacitance targets of all the user-defined placement delay groups within one clock circuit/macro with all the other corresponding user-defined placement delay groups of the clock circuits/macros on the integrated circuit, a user-defined placement delay group placed in a horizontal row in a clock circuit/macro in the lower left of the integrated chip would have the same minimal skew and other electrical characteristics of a user-defined placement delay group in a clock circuit/macro in the upper right of the integrated chip. In order to minimize skew between all outputs of all level two clock circuits as measured, the programmable delay elements are set to minimum delay. This, along with the timing of the delay elements themselves, ensures not only that the resulting delay on the clocks is as close as possible to the programmed amounts but also that the non-delayed clocks are as close as possible to the delayed clocks when the programmed delay is zero.

In step 770, the number and sizes of the circuits that must be within the bounding box in close proximity to the clock root drivers are determined. Then, to the distances and positions, a factor, e.g., which may be on the order of approximately fifteen percent, is added for ease of placement and wireability, as in block 780. At step 790, the automated placement program produces a design having the desired clocking requirements with minimal or no skew and which allows for maximum freedom to design the entire integrated chip. In this fashion, the automated placement program allows the connectivity of some circuits to overflow from the bounding box into the area surrounding the level two clock drivers but which would probably never be seen by manual placement.

Thus, the design constraints considered by the automated placement of the clock distribution are the placement of those critical circuit elements surrounding the clock circuits within the bounding boxes. Then the wire capacitance targets from the root driver of each respective clock circuit/macro to the first circuit element of each user-defined placement group or other tightly coupled logic circuit group matches the wire capacitance target of a corresponding user-defined placement group of another clock circuit/macro while independently balancing the input pin loads of each respective clock circuit/macro. Further, the invention can produce a clock distribution network in which the outputs of different level two clock circuits or macros, i.e., different sizes, number of outputs, delay domains, etc., have minimal skew with respect to each other. The benefits of the automated placement program with consideration of the above constraints is much faster than manual placement which requires no additional physical design rules. Automatic place and route tools, moreover, can produce these low skew clock macros with little or no manual intervention thus easing the design effort required and allowing for flexibility if late changes were required. Unlike other solutions which have excluded all other circuits from the bounding box areas, the invention further produces low skew while minimizing the impact on the other place and route objects in the design by allowing these other objects to be placed and routed within the bounding box.

The detailed description above is provided to illustrate the specific embodiments of the present invention and is not intended to be limited. Numerous variations and modifications are possible within the scope of the present invention. For example, although the invention has been described with respect to a second level clock distribution network, the same principles apply for the design of any circuit having a signal which is propagated throughout the circuit and whose skew must be controlled or minimized. The present invention is thus defined by the appended claims.

What is claimed is:

1. A method of automated placement of circuit elements in the design of an integrated circuit, comprising the steps of:
   (a) defining a plurality of bounding boxes, each having a root driver within the bounding box in the design of the integrated circuit;
   (b) within each bounding box, connecting a first circuit element of at least one user-defined placement group to each root driver maintaining substantially the same capacitance target within all of said bounding boxes.

2. The method of claim 1, wherein said root driver is a driver circuit of a clock circuit in a clock distribution network.

3. The method of claim 2, wherein said clock distribution network is a second level clock distribution network of a computer system memory interface.

4. The method of claim 1, wherein said user-defined placement group comprises the following circuit elements:
   (a) a gate connected to said root driver as said first circuit element,
   (b) a clock delay to receive the output of said gate, and
   (c) a clock splitter connected to receive the output of said clock delay.

5. The method of claim 4, wherein said clock delay is a programmable clock delay and a first stage of said delay is contained within said bounding box.

6. The method of claim 5, wherein said clock delay has multiple stages.

7. A method of automated design of a clock distribution network having minimal clock skew throughout an integrated circuit, comprising the steps of:
   (a) defining a plurality of bounding boxes having tightly-coupled logic, each of said bounding boxes having a clock root driver connected to an input source of a clock signal;
   (b) within each bounding box, connecting a clock delay group to each root driver maintaining substantially the same wire capacitance target and input pin load balance for each of said clock delay groups having a same clock delay within all of said bounding boxes and wherein each of said clock delay groups comprise a gate connected to said root driver, a programmable delay connected to said gate, and a clock splitter to receive the output of said programmable delay.

8. An automated method of designing a clock distribution network on an integrated circuit, comprising:
   (a) inputting a design specification of said integrated circuit, said integrated circuit having a clock source;
   (b) determining the number of clock circuits required for said integrated circuit;
   (c) dividing the design of said integrated circuit into as many areas as said number of clock circuits;

(d) preplacing a clock root driver connected to said clock source in a fixed position in each of said areas;

(e) placing tightly-coupled logic together in a vicinity surrounding each of said clock root drivers;

(f) in each of said vicinities, placing user-defined groups of said tightly-coupled logic to be electrically connected to said clock root driver;

(g) in each of said vicinities, determining capacitance targets for a first circuit element of each of said user-defined groups such that each of said first circuit element in one of said vicinities corresponds to the same capacitance target for a corresponding first circuit element of other of said user-defined groups in other of said vicinities;

(h) recording the coordinates of each of said clock root driver and each of said first circuit elements for each of said vicinities.

9. A computer readable medium having an executable program operative to control a computer for designing a clock signal distribution network on an integrated circuit, said program comprising:

(a) evaluating a specification for an integrated circuit with respect to said clock signal distribution network and determining the level and number of clock distribution circuits having tightly-coupled logic required for said integrated circuit;

(b) arranging said clock distribution circuits from an input source of said clock signal so that said clock distribution circuits are distributed on said integrated circuits;

(c) placing a root driver connected to said input source in each of said clock distribution circuits; and (d) placing a number of clock delay circuit groups to be electrically connected within a capacitance target to said root driver such that the capacitance target for one of said clock delay circuit groups in one of said clock distribution circuits is substantially the same as the capacitance target of the same clock delay circuit group of another of said clock distribution circuits.

10. An apparatus to design a signal distribution network in an integrated circuit, said apparatus comprising:

(a) means to input a design specification of said integrated circuit; said design specification having an input source of an electronic signal to be distributed throughout said integrated circuit;

(b) means to route said signal from said input source to a plurality of areas in which tightly-coupled logic circuits are to be placed, (c) means to place a signal root driver in each of said areas;

(d) means to determine a capacitance target for a number of user-defined placement groups to be connected to each signal root driver such that said capacitance target minimizes skew of said signal distributed throughout said integrated circuit;

(e) means to place said user-defined placement groups in each of said areas in accordance with said capacitance targets; and (f) means to record positions of said signal root driver and said user-defined placement groups.

* * * * *